US010231356B2

(12) United States Patent
Marroquin et al.

(10) Patent No.: US 10,231,356 B2
(45) Date of Patent: Mar. 12, 2019

(54) COLD PLATE

(71) Applicant: International Business Machines Corporation, Armonk, NY (US)

(72) Inventors: Christopher M. Marroquin, Rochester, MN (US); Kevin M. O'Connell, Rochester, MN (US); Mark D. Schultz, Ossining, NY (US); Shurong Tian, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/803,945

(22) Filed: Nov. 6, 2017

(65) Prior Publication Data

US 2018/0124949 A1 May 3, 2018

Related U.S. Application Data

(62) Division of application No. 15/339,710, filed on Oct. 31, 2016, now Pat. No. 9,894,801.

(51) Int. Cl.
*H05K 7/20* (2006.01)
*H01L 23/427* (2006.01)
*H01L 23/473* (2006.01)

(52) U.S. Cl.
CPC ....... *H05K 7/20254* (2013.01); *H01L 23/427* (2013.01); *H01L 23/473* (2013.01); *H05K 7/2049* (2013.01); *H05K 7/20509* (2013.01)

(58) Field of Classification Search
CPC ..... H01L 23/473; H01L 23/427; H01L 23/34; H01L 23/3672; H01L 23/3677;
(Continued)

(56) References Cited

U.S. PATENT DOCUMENTS

| 2,554,185 | A | * | 5/1951 | Giegerich | ............. | H01F 27/025 |
| | | | | | | 165/104.33 |
| 4,549,603 | A | * | 10/1985 | Shirai | ................... | F28D 1/0316 |
| | | | | | | 165/104.33 |

(Continued)

OTHER PUBLICATIONS

F. Zhou, et al.: "A Novel Design of Hybrid Slot Jet and Mini-Channel cold Plate for Electronics Cooling", 31st Semi-Therm Symposium, IEEE, 2015, pp. 60-67.

(Continued)

*Primary Examiner* — Adam B Dravininkas
(74) *Attorney, Agent, or Firm* — Patterson + Sheridan, LLP

(57) ABSTRACT

A cold plate, an electronic assembly including a cold plate, and a method for forming a cold plate are provided. The cold plate includes an interface plate and an opposing plate that form a plenum. The cold plate includes a plurality of active areas arranged for alignment over respective heat generating portions of an electronic assembly, and non-active areas between the active areas. A cooling fluid flows through the plenum. The plenum, at the non-active areas, has a reduced width and/or reduced height relative to the plenum at the active areas. The reduced width and/or height of the plenum, and exterior dimensions of cold plate, at the non-active areas allow the non-active areas to flex to accommodate surface variations of the electronics assembly. The reduced width and/or height non-active areas can be specifically shaped to fit between physical features of the electronics assembly.

18 Claims, 9 Drawing Sheets

(58) Field of Classification Search
CPC ........ G06F 1/20; G06F 2200/201; F28F 3/12; F28F 3/02; F28F 2260/02; F28F 3/022; H05K 7/20772; H05K 7/20781; H05K 7/20836; H05K 7/20254; H05K 7/20927; H05K 7/20809; H05K 7/20218; H05K 7/20763; H05K 7/2049; H05K 7/20509
See application file for complete search history.

(56) References Cited

U.S. PATENT DOCUMENTS

| | | | |
|---|---|---|---|
| 4,765,397 A * | 8/1988 | Chrysler | H01L 23/473 165/104.33 |
| 4,964,458 A * | 10/1990 | Flint | H01L 23/3672 165/46 |
| 5,205,348 A * | 4/1993 | Tousignant | F28F 3/12 165/170 |
| 5,529,120 A * | 6/1996 | Howard | F28F 3/02 165/104.33 |
| 5,860,472 A * | 1/1999 | Batchelder | F28F 3/02 165/185 |
| 6,026,895 A * | 2/2000 | Moresco | F28F 3/02 165/185 |
| 6,111,749 A | 8/2000 | Lamb et al. | |
| 6,146,779 A * | 11/2000 | Walsh | H01M 8/0228 429/423 |
| 6,504,720 B2 | 1/2003 | Furuya | |
| 6,988,543 B2 | 1/2006 | Walczak | |
| 7,017,651 B1 | 3/2006 | Wilson et al. | |
| D553,656 S | 10/2007 | Reeves et al. | |
| 7,316,263 B2 | 1/2008 | Lofland et al. | |
| 8,833,438 B2 | 9/2014 | Wyatt et al. | |
| 9,219,022 B2 | 12/2015 | Parida | |
| 2001/0014029 A1 | 8/2001 | Suzuki et al. | |
| 2008/0236795 A1* | 10/2008 | You | H01L 23/427 165/104.21 |
| 2008/0237847 A1 | 10/2008 | Nakanishi et al. | |
| 2009/0213541 A1 | 8/2009 | Butterbaugh et al. | |
| 2012/0014066 A1 | 1/2012 | Morino et al. | |
| 2012/0018128 A1 | 1/2012 | Chang et al. | |
| 2013/0187453 A1 | 7/2013 | Flett et al. | |
| 2013/0214406 A1 | 8/2013 | Schultz | |
| 2015/0136372 A1 | 5/2015 | Sherbeck | |
| 2015/0369545 A1* | 12/2015 | Naritomi | B23P 15/26 165/76 |
| 2016/0010772 A1 | 1/2016 | Tiberghien et al. | |
| 2016/0056088 A1 | 2/2016 | Uhlemann et al. | |
| 2016/0109197 A1 | 4/2016 | Severson et al. | |
| 2016/0192534 A1* | 6/2016 | Pons | H01L 23/3672 361/689 |
| 2016/0290728 A1 | 10/2016 | Coteus et al. | |
| 2016/0338222 A1* | 11/2016 | Reeves | H05K 7/20254 |

OTHER PUBLICATIONS

J. Fernandes, et al.: "Multi-Deswign Variable Optimization for a Fixed Pumping Power of a Water-Cooled Cold Plate for High Power Electronics Applications", 13th IEEE ITHERM Conference, IEEE, 2012, pp. 684-692.

U.S. Appl. No. 15/339,710 entitled "Cold Plate," filed Oct. 31, 2016.

* cited by examiner

COLD PLATE

CROSS-REFERENCE TO RELATED APPLICATIONS

This application is a divisional of U.S. patent application Ser. No. 15/339,710, filed Oct. 31, 2016. The aforementioned related patent application is herein incorporated by reference in its entirety.

STATEMENT OF GOVERNMENT SUPPORT

This invention was made with government support under contracts awarded by the Department of Energy (Contract Nos. 4000131696 and B604142 awarded by Oak Ridge National Labs and Lawrence Livermore National Labs, respectively). The government has certain rights in the invention.

BACKGROUND

In certain applications, components of electrical systems are water cooled. In such electrical systems, a plenum is formed from sheet metal or another thermally conductive material. An exterior surface of the sheet metal or other thermally conductive material is arranged in contact (or conductive communication) with heat-generating components of the electrical system. Water, often treated with chemicals to avoid corrosion, flows through the plenum. Heat from the components of the electrical system is transferred to the sheet metal or other thermally conductive material and then to the water in the plenum. The water flowing through the plenum transports the heat away from the components of electrical system, thereby keeping the components cool.

SUMMARY

According to one embodiment, a cold plate for cooling electronics comprises an interface plate configured for arrangement on an electronics assembly. The interface plate comprises a plurality of active areas arranged for alignment over respective heat-generating portions of the electronics assembly and non-active areas between the active areas. The cold plate also comprises an opposing plate. Edges of the interface plate and the opposing plate are joined to form a plenum therebetween. The plenum defines a cooling fluid flow axis from a first end of the plenum to the second end of the plenum. The plenum includes active plenum volumes aligned with the active areas of the interface plate and non-active plenum volumes aligned with the non-active areas of the interface plate. A first width of the active plenum volumes in a first transverse direction to the cooling fluid flow axis is larger than a second width of the non-active plenum volumes in the first transverse direction. The cold plate also comprises a plurality of cooling fins arranged in each of the plurality of active plenum volumes. The surfaces of the cooling fins are arranged along the cooling fluid flow axis.

According to one embodiment, an electronic assembly comprises a plurality of electrical components arranged in a row. Each of the plurality of electrical components includes a heat-generating portion. The electronic assembly further comprises a cold plate arranged on the plurality of electrical components. The cold plate comprises an interface plate arranged on the plurality of electrical components. The interface plate comprises a plurality of active areas arranged for alignment over respective heat-generating portions of the electrical components and non-active areas between the active areas. The cold plate also includes an opposing plate. Edges of the interface plate and the opposing plate are joined to form a plenum therebetween. The plenum defines a cooling fluid flow axis from a first end of the plenum to the second end of the plenum. The plenum includes active plenum volumes aligned with the active areas of the interface plate and non-active plenum volumes aligned with the non-active areas of the interface plate. A first width of the active plenum volumes in a first transverse direction to the cooling fluid flow axis is larger than a second width of the non-active plenum volumes in the first transverse direction. The cold plate also comprises a plurality of cooling fins arranged in each of the plurality of active plenum volumes. The surfaces of the cooling fins are arranged along the cooling fluid flow axis.

According to one embodiment, a method of forming a cold plate comprises stamping an interface plate from sheet metal. The interface plate is configured for arrangement on an electronics assembly. The interface plate comprises a plurality of active areas arranged for alignment over respective heat-generating portions of the electronics assembly and non-active areas between the active areas. The method also comprises affixing a plurality of cooling fins to the interface plate at each of the plurality of active area. The method also comprises stamping an opposing plate from sheet metal. The method also comprises joining edges of the first and opposing plates. Edges of the interface plate and the opposing plate form a plenum therebetween. The plenum defines a cooling fluid flow axis from a first end of the plenum to the second end of the plenum. The plenum includes active plenum volumes aligned with the active areas of the interface plate and non-active plenum volumes aligned with the non-active areas of the interface plate. A first width of the active plenum volumes in a first transverse direction to the cooling fluid flow axis is larger than a second width of the non-active plenum volumes in the first transverse direction. The surfaces of the cooling fins are arranged along the cooling fluid flow axis.

DETAILED DESCRIPTION

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" or "the disclosure" shall not be construed as a generalization of any inventive subject matter disclosed herein and shall not be considered to be an element or limitation of the appended claims except where explicitly recited in a claim (s).

Figure 1:
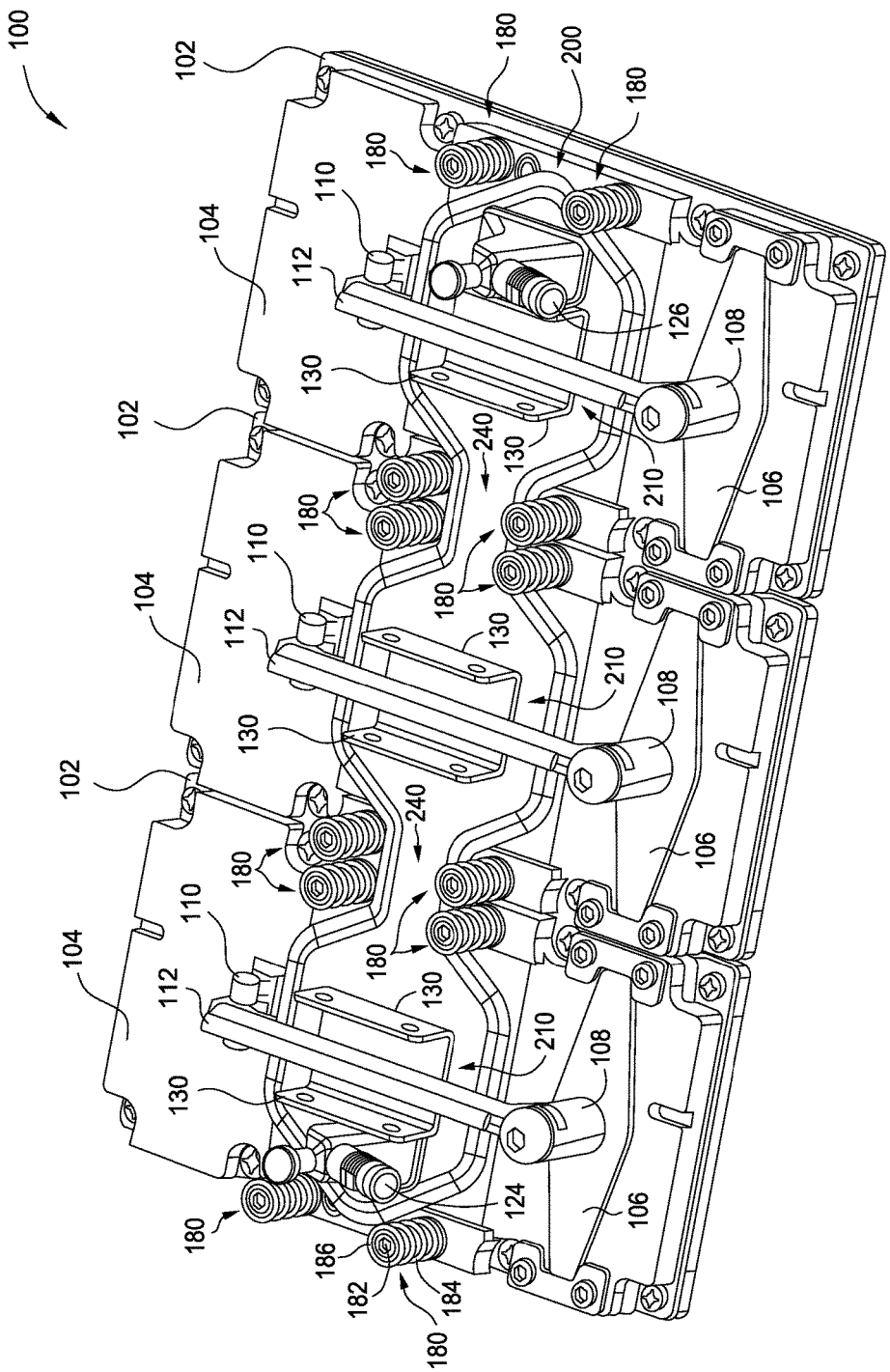
FIG. 1 is a perspective view of an electronic assembly with a cold plate according to one embodiment arranged thereon.

In certain electronics water cooling applications, several components of an electrical system are aligned in a row such that it is economical to cool the several components with a single water cooling system. FIG. 1 is a perspective view of an electrical assembly 100 with three electrical components 102 arranged in a row, and with a cold plate 200, according to one embodiment, arranged thereon. The three electrical components 102 could be graphics processing units (GPUs), for example. The three electrical components 102 are covered by thermal spreaders 104. In one embodiment, the thermal spreaders 104 are blocks of aluminum, and heat from the electrical components 102 is transferred to the thermal spreaders 104. The three thermal spreaders 104 are in contact with a cold plate 200 according to one embodiment. The cold plate 200 includes a cooling fluid insertion port 124 arranged at a first end of the cold plate 200 and a cooling fluid extraction port 126 arranged at a second end of the cold plate 200. The cooling fluid insertion port 124 and the cooling fluid extraction port 126 may be connected via tubing (not shown) to a pump and cooling fluid reservoir (not shown). Cooling fluid (e.g., treated water) flows into the cold plate 200 via the cooling fluid insertion port 124 and flows out of the cold plate 200 via the cooling fluid extraction port 126.

The cold plate 200 is held in place and pressed against the thermal spreaders 104 with clamps 112. The clamps 112 are connected to the thermal spreaders 104 via hinges 110 such that the clamps 112 can be moved into and away from contact with the cold plate 200. The clamps 112 are also connectable to latches 108 (e.g., bayonet style connections) when the clamps are moved into contact with the cold plate 200. The latches 108 may be affixed to leaf springs 106, which can regulate an amount of pressure applied by the clamps 112 to the cold plate 200. The cold plate 200 can optionally include U channels 130 arranged thereon. In one embodiment, the cold plate 200 comprises a nearly-pure copper (e.g., 99.9% pure copper), which is a soft material. The U channels 130 may be made of steel. Such steel U channels 130 distribute the load from the clamps 112 across a larger surface of the cold plate 200, minimizing the likelihood of dents, dings, or other structural damage to the cold plate 200.

Ideally, the surfaces of the thermal spreaders 104 (or other exposed electrical components to be cooled) contacted by the cold plate 200 are level and even with respect to one another. However, due to manufacturing tolerances and variances, the surfaces of the thermal spreaders 104 typically include slight variations from one to the next. For example, the heights of the surfaces of the thermal spreaders 104 may vary slightly due to manufacturing variations. As another example, the surfaces of the thermal spreaders 104 may be slightly tilted with respect to one another. As a result of the slight variations of the surfaces of the thermal spreaders 104, the cold plate 200 flexes to maintain contact with the three thermal spreaders 104.

In embodiments described herein, a cold plate includes large widths (a dimension in a first direction transverse to the cooling fluid flow axis) in "active" areas arranged over the heat concentrated areas of the electrical system 100 (e.g., over the thermal spreaders 104) and smaller widths in the first direction in "non-active" areas arranged between the heat concentrated areas of the electrical system (e.g., between the thermal spreaders 104). In various embodiments, the cold plate also includes large thicknesses (a dimension in a second direction transverse to the cooling flow direction and transverse to the first direction) in the active areas and smaller thicknesses in the second direction in the non-active areas. The reduced width in the first direction (and, optionally, the reduced thickness in the second direction) reduce the dimensions (i.e., footprint) of the cold plate 200 on the electrical components (e.g., the thermal spreaders 104) such that the electrical components do not have to be redesigned or may only require limited modifications to accommodate the cold plate 200. In at least one embodiment, the reductions in width can be made to specifically avoid certain structures of the electrical components. Additionally, the reduced width in the first direction (and, optionally, the reduced thickness in the second direction) reduces torsional and bending stiffness of the cold plate 200 in the non-active areas such that the cold plate 200 can be flexed, bent, or otherwise deformed using lower forces to accommodate variations from one electrical component to the next (e.g., from one thermal spreader 104 to the next thermal spreader 104).

The cold plate 200 includes three active areas 210 arranged over heat concentrated areas of the thermal spreaders 104. The cold plate 200 also includes two non-active areas 240 arranged between and connecting the respective active areas 210. The non-active areas 240 are narrower than the active areas 210. Specifically, the non-active areas 240 have a narrower width that accommodate placement of the cold plate 200 between spring fasteners 180 that couple the thermal spreaders 104 to the electrical components 102 thereunder. The spring fasteners 180 include a threaded rod 182 extending through holes in the respective thermal spreaders 104 and engaged in threaded holes in the electrical components 102. A spring 184 (or other elastomeric device) is placed over the threaded rod 182 and a cap 186 (e.g., a washer) is fastened to an end of the threaded rod 182. The cap 186 and the spring 184 push the thermal spreaders 104 into contact with the electrical components 102 such that heat generated by the electrical components 102 is conductively transferred to the thermal spreaders 104. By configuring the cold plate 200 to include non-active areas 240 having widths that fit within the spring fasteners 180, the spring fasteners 180 do not have to be moved to other locations. Also, the narrower widths of the non-active areas 240 enable the non-active areas 242 flex, bend, or otherwise deform at relatively low forces to enable the active areas 210 to contact the thermal spreaders 104.

Figure 2:
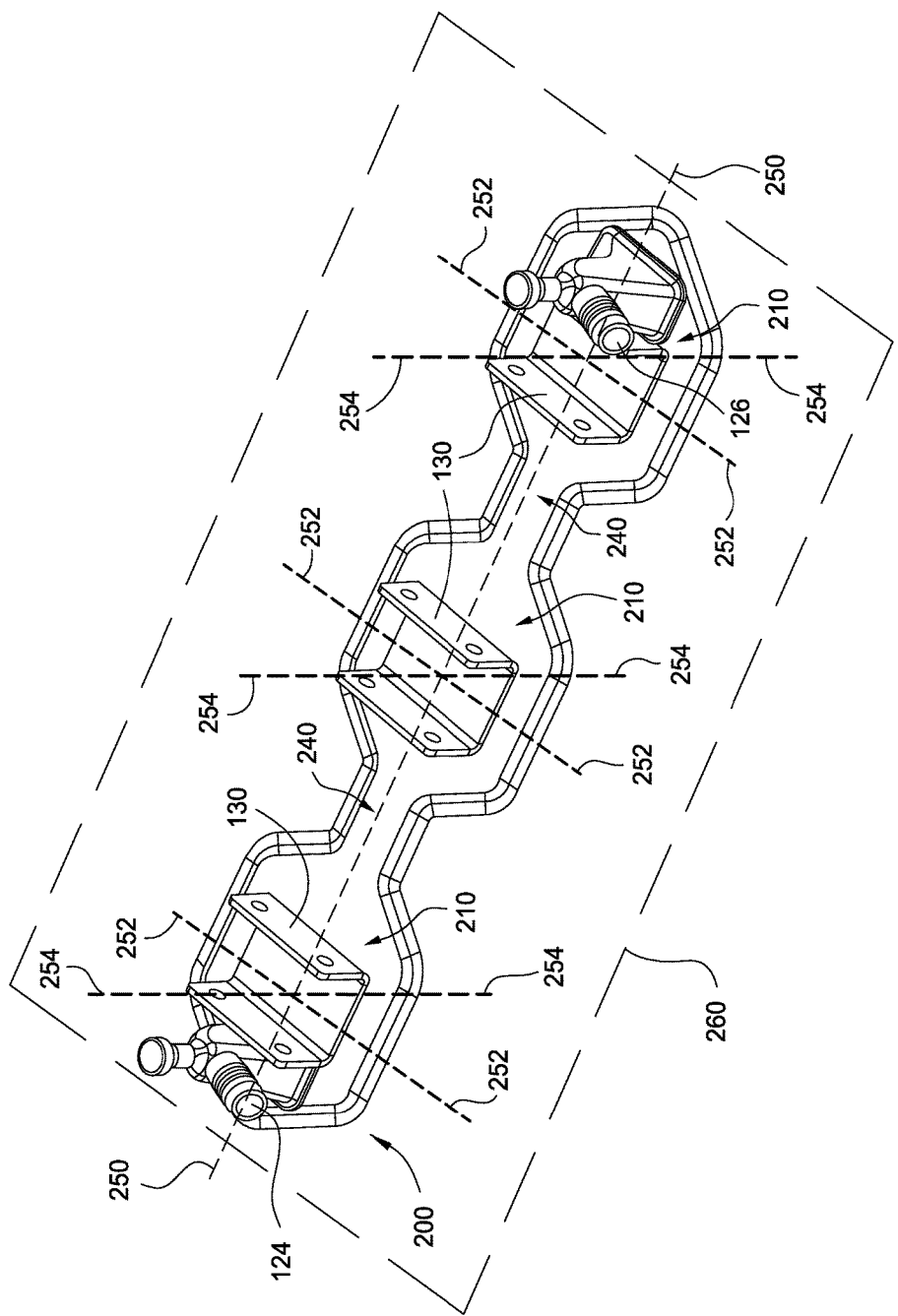
FIG. 2 is a perspective view of the cold plate of FIG. 1.

FIG. 2 is a perspective view of the cold plate 200 of FIG. 2. The cold plate 200 is illustrated with a first broken line 250, which represents a cooling fluid flow axis from the cooling fluid insertion port 124 to the cooling fluid extraction port 126. The cold plate 200 is also illustrated with second broken lines 252, which represents a first transverse direction with respect to the cooling fluid flow axis 250. The cold plate 200 is also illustrated with third broken lines 254, which represent a second transverse direction with respect to the cooling fluid flow axis 250 and the first transverse direction 252. The cooling fluid flow axis 250 and the first transverse direction 252 define a plane 260 with respect to the cold plate 200.

Figure 3:
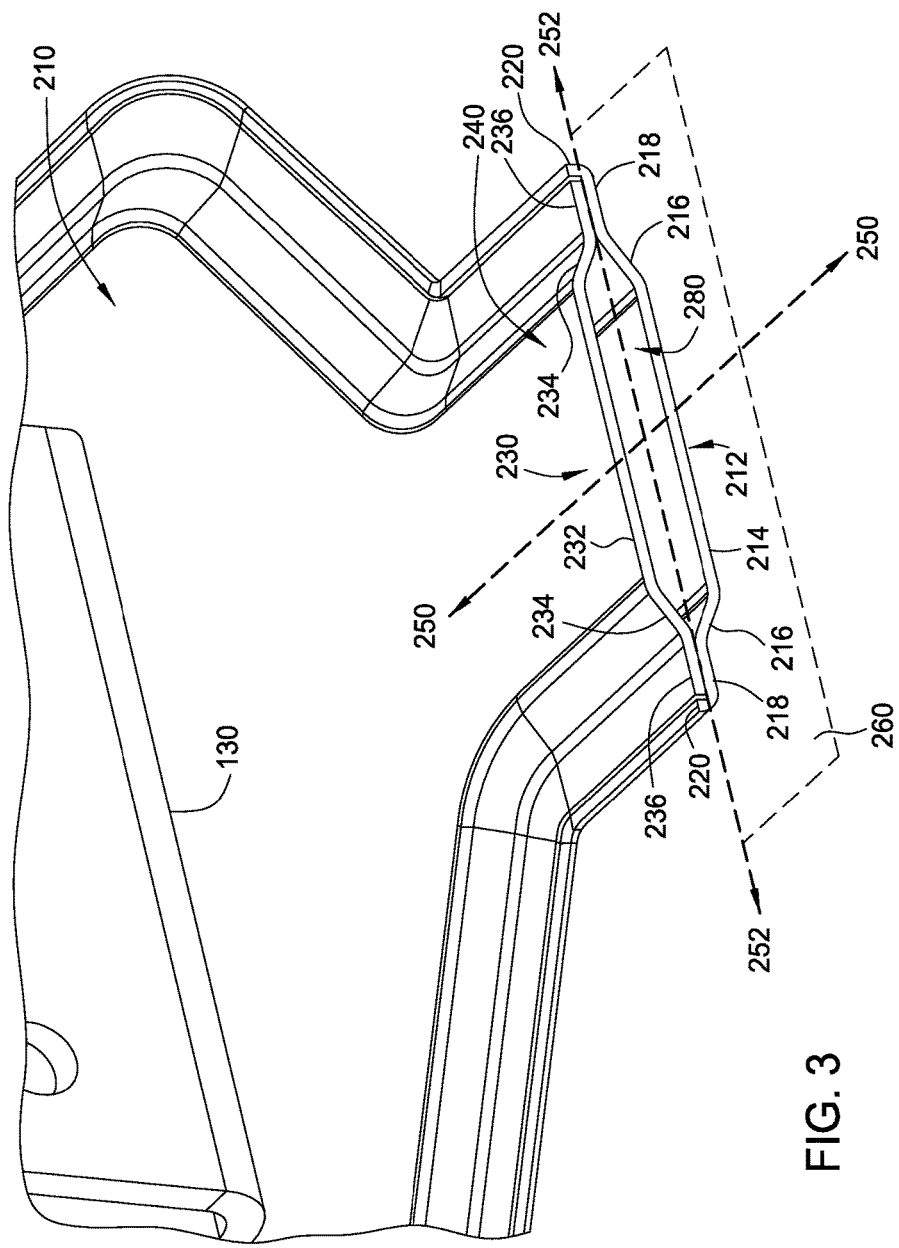
FIG. 3 is a detail, perspective, cross-sectional view of the cold plate of FIG. 1, wherein the cross-section is through a non-active area of the cold plate in a transverse direction with respect to the cooling fluid flow axis.

FIG. 3 is a detail, perspective, cross-sectional view of the cooling plate 200, wherein the cross-section is taken through a non-active area 240 in the first transverse direction 252. The cooling plate 200 comprises an interface plate 212 that is configured for arrangement on electronics assembly (e.g., on the thermal spreader 104 in FIG. 1) and an opposing plate 230. The interface plate 212 and the opposing plate 230 are joined along edges to form a plenum 280 therebetween. The cooling fluid flows from the cooling fluid insertion port 124 to the cooling fluid extraction port 126 through the plenum 280. The interface plate 212 may be stamped from sheet metal, such as 99.9% pure copper, and includes a flat surface 214, surrounded by a bevel 216, and the bevel 216 is surrounded by a flange 218. The flange 218 optionally may include an outer lip 220 that facilitates alignment of the interface plate 212 with the opposing plate 230, discussed in greater detail below. The opposing plate 230 may be stamped from sheet metal, such as 99.9% pure copper, and includes a flat surface 232, surrounded by a bevel 234, and the bevel 234 is surrounded by a flange 236. As shown in FIG. 3, the cooling fluid flow axis 250 is aligned with the interface between the flanges 218 and 236 of the interface plate 212 and the opposing plate 230, respectively. The flat surfaces 212 and 232 and the bevels 216 and 234 of the interface plate 212 and the opposing plate 230, respectively, may be identical such that the plenum 280 has a symmetric cross-sectional shape with respect to the plane 260, defined by the cooling fluid flow axis 250 and the first transverse direction 250 when the plane 260 is aligned with an intersection of the flanges 218 and 236.

To assemble the cold plate 200, the interface plate 212 and the opposing plate 230 are aligned with respect to one another. As discussed above, the interface plate 212 can include an outer lip 220 extending from the flange 218. The outer lip 220 could engage the flange 236 of the opposing plate 230 to urge the opposing plate 230 into alignment with the interface plate 212. Once the interface plate 212 and opposing plate 230 are aligned, the flanges 218 and 236 of the interface plate 212 and the opposing plate 230 can be bonded. For example, the flanges 218 and 236 are bonded together (e.g., through brazing, welding, or bonded with epoxy). The bonding of the flanges 218 and 236 creates a watertight seal such that cooling fluid in the plenum 280 does not leak between the flanges 218 and 236. As discussed above, the outer lip 220 of the flange 218 may facilitate alignment of the flanges 218 and 236. The outer lip 220 of the flange 218 may also prevents bonding material (e.g., brazing material) used to bond and seal the flanges 218 and 236 from leaking out from between the flanges 218 and 236.

Figure 4:
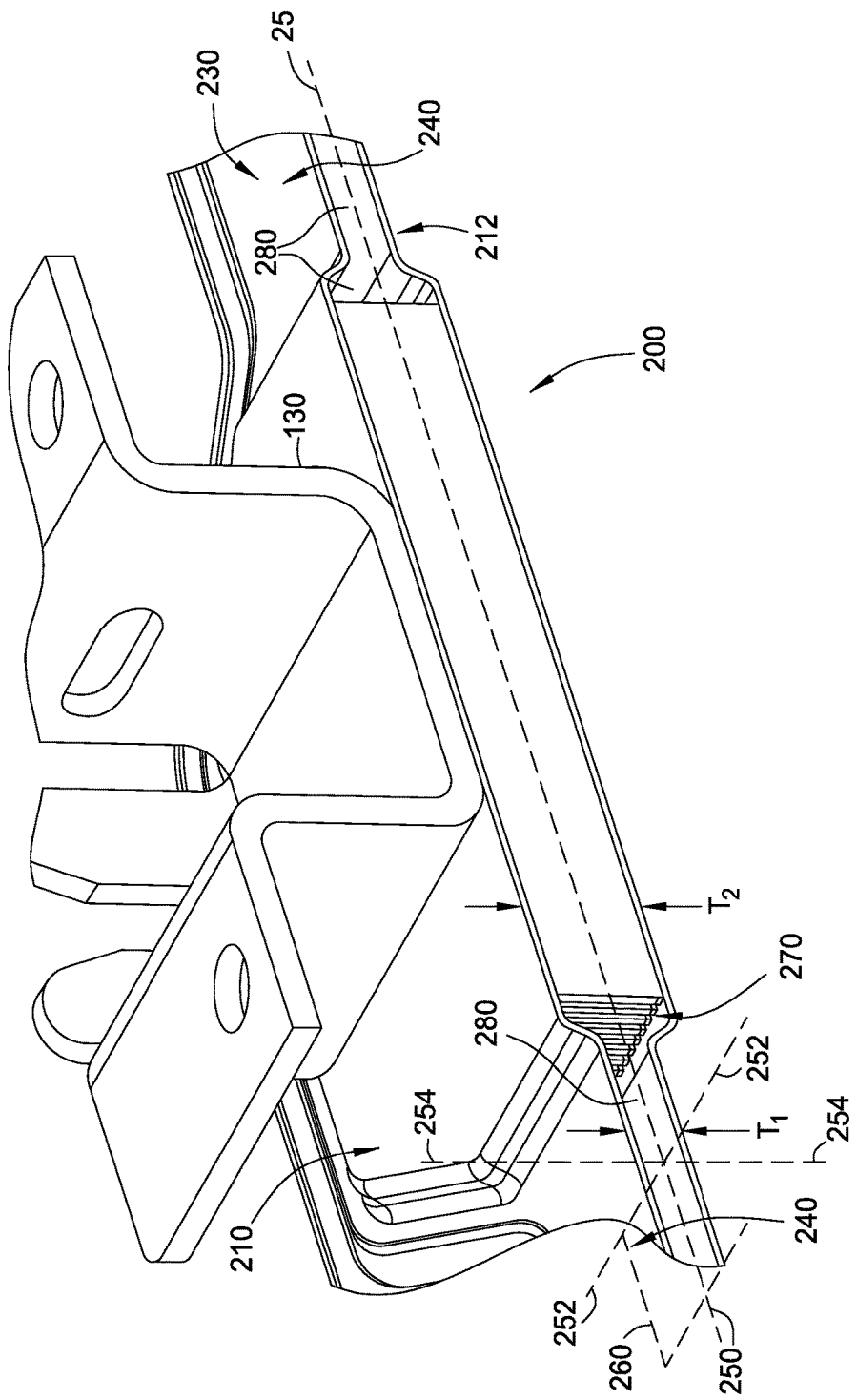
FIG. 4 is a detail, perspective, cross-sectional view of the cold plate of FIG. 1, where the cross-section is through an active area of the cold plate in the cooling fluid flow axis.

FIG. 4 is a detail, perspective, cross-sectional view of the cold plate 200, wherein the cross-section is taken through an active area 210 and adjacent non-active areas 240 along the cooling fluid flow axis 250. The plenum 280 in the active area 240 includes a plurality of cooling fins 270 extending from the interface plate 212 to the opposing plate 230. The cooling fins 270 include surfaces aligned along the cooling fluid flow axis 250. The cooling fins 270 facilitate heat transfer from the electrical components (e.g., the thermal spreaders 104) to the cooling fluid in the plenum 280. Heat from the electrical components is transferred to the interface plate 212 and thereafter to the cooling fins 270 via conductive heat transfer. The cooling fins 270 provide a large surface area over which the cooling fluid in the plenum 280 flows such that heat is transferred from the cooling fins 270 to the cooling fluid.

FIG. 4 also illustrates that the plenum 280 in the active areas 210 have different thicknesses (dimensions in the second transverse direction 254) than the non-active areas 240 in at least one embodiment. In the embodiment illustrated in FIG. 4, the non-active areas 240 of the plenum 280 have a first thickness $T_1$ and the active area 210 of the plenum 280 has a second thickness $T_2$. The increased thickness of the plenum 280 in the active areas 210 relative to the non-active areas 240 results in slower cooling fluid flow in the active areas 210, providing additional time for the cooling fluid to absorb heat from the cooling fins 270.

Figure 5:
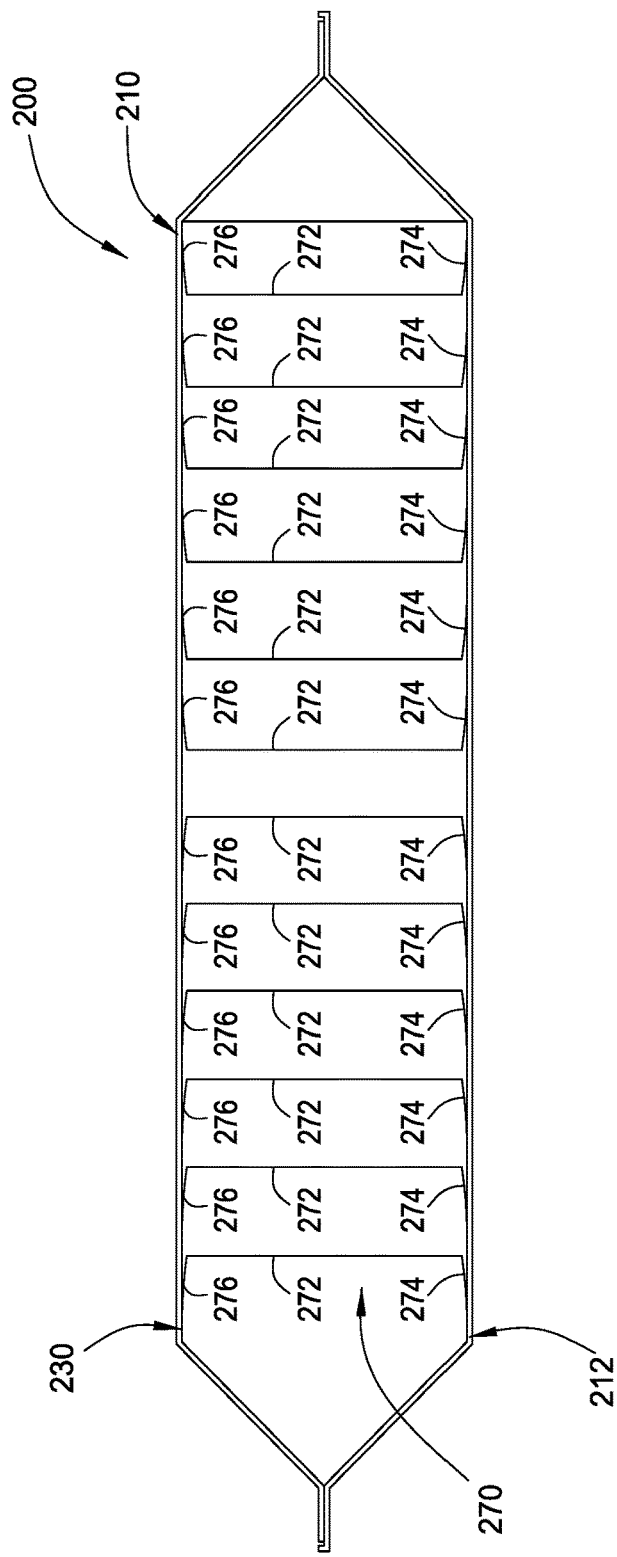
FIG. 5 is a cross-sectional end view of an active area of the cold plate of FIG. 1.

FIG. 5 is a cross-sectional end view of an active area 210 of the cold plate 200, illustrating the cooling fins 270 arranged therein. Each of the plurality of cooling fins 270 includes a spanning member 272 extending from the interface plate 212 to the opposing plate 230. Each of the cooling fins 270 also includes a first leg 274 extending from the spanning member 272 at an angle such that the first leg 274 abuts an interior surface of the interface plate 212. For example, the first legs 274 could be arranged at a 90° angle relative to the respective spanning members 272. Each of the cooling fins 270 also includes a second leg 276 extending from the spanning member 272 at an angle such that the second leg 276 abuts an interior surface of the opposing plate 230. For example, the first legs 274 could be arranged at a 90° angle relative to the respective spanning members 272. The plurality of cooling fins 270 are affixed in the active areas 210 by attaching the first and second legs 274 and 276 to the interface plate 212 and the opposing plate 230, respectively. For example, the first and second legs 274 and 276 may be brazed to the interface plate 212 and the opposing plate 230. During assembly, the first legs 274 of the cooling fins 270 could be brazed to the interface plate 212 before the interface plate 212 and the opposing plate 230 are joined, discussed above. After the interface plate 212 and the opposing plate 230 are joined, the second legs 274 of the cooling fins 270 could be brazed to the opposing plate 230.

Figure 6:
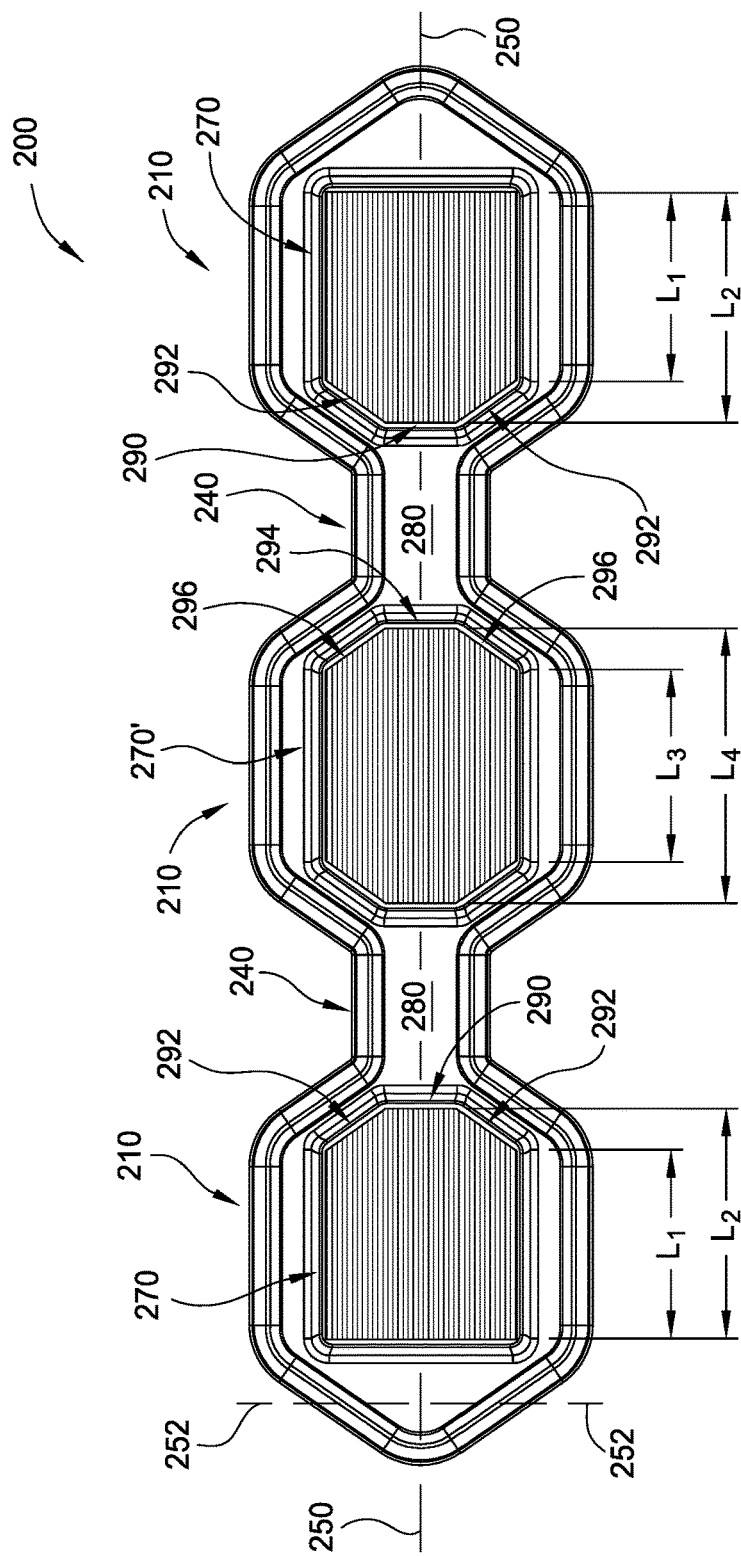
FIG. 6 is a top cross-sectional view of the cold plate of FIG. 1.

FIG. 6 is a cross-sectional top view of the cold plate 200, illustrating the cooling fins 270 arranged within active areas 210 of the plenum. As shown in FIG. 6, in at least one embodiment, the cooling fins 270 have different lengths in different regions of the active areas 210. For example, in the left-most and right-most active areas 210 illustrated in FIG. 6, cooling fins in central regions 290 have cooling fins with a length $L_2$ along the cooling fluid flow axis 250. Cooling fins in side regions 292 have cooling fins with lengths varying from equal to or slightly shorter than length $L_2$ to a length $L_1$ along the cooling fluid flow axis 250, wherein the length $L_1$ is shorter than the length $L_2$. In at least one embodiment, the lengths of the cooling fins in the side regions 292 decreases linearly at increasing distances from the central region 290. In another embodiment, all of the cooling fins in the side regions 292 could have a length $L_2$.

FIG. 6 also shows that, in the central active area 210 illustrated in FIG. 6, cooling fins in a central region 294 have a length $L_4$ along the cooling fluid flow axis 250. Cooling fins inside regions 296 have cooling fins with length varying from equal to or slightly shorter than the length $L_4$ to a length $L_3$ along the cooling fluid flow axis 250, wherein the length $L_3$ is shorter than the length $L_4$. In at least one embodiment, the lengths of the cooling fins the side regions 296 decreases linearly at increasing distances from the central region 294. In various embodiments, the cooling fins in the side regions 296 could all have the same length $L_3$.

Figure 7:
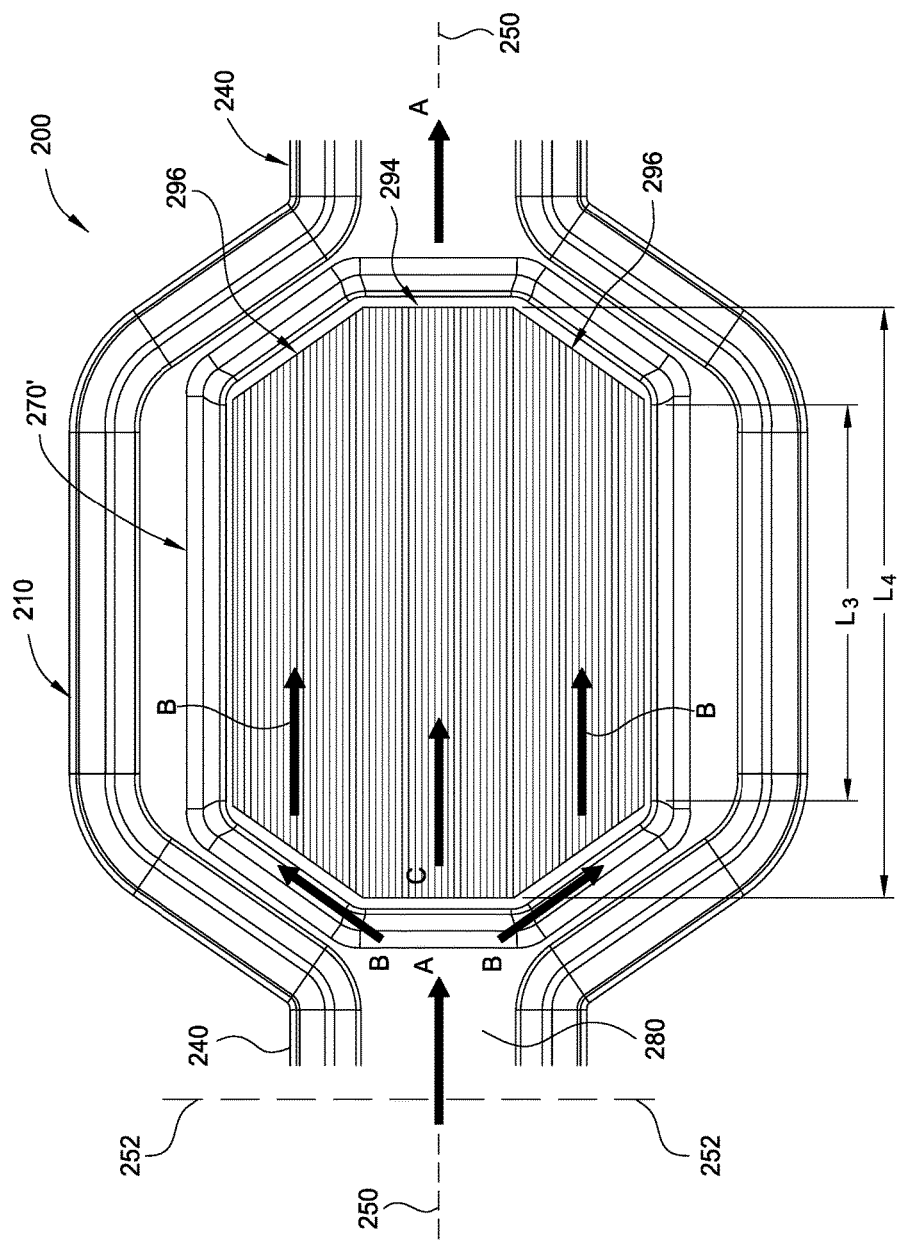
FIG. 7 is a detail, top cross-sectional of the cold plate of FIG. 1.

FIG. 7 is a top cross-sectional view of the center active area 210 of the cooling plate 200, illustrating the plurality of cooling fins 270' with the central region 294 having cooling fins with a length $L_4$ and side regions having lengths varying from $L_4$ to $L_3$, as discussed above. The plurality of cooling fins 270' with variable lengths provides differential fluid flow restrictions to encourage distribution of the cooling fluid throughout the plenum 280 and the active area. Absent any flow restrictions, cooling fluid traveling from one non-active area 240 in the plenum 280 to the next non-active area 240 through an active area 210 in the direction of arrow A would tend to travel straight across the active area 210 with minimal spread in the first transverse direction 252. As a result, the side regions 296 of the active areas 210 would not efficiently extract heat from the electrical components (e.g., the thermal spreaders 104). The lengths of the cooling fins 270' provide varied flow restrictions along the first transverse direction 252 such that cooling fluid flowing from one non-active area 240 in the plenum 280 into the active area 210 is encouraged to spread in the first transverse direction 252. For example, the cooling fins in the central region 294 having length $L_4$ provide a larger flow restriction than the cooling fins in the side regions 296 having lengths between $L_4$ and $L_3$. The reduced flow restriction of the side regions 296, relative to the central region 294, encourages some of the cooling fluid flowing into the active area 210 to move transversely in the direction of arrows B to flow through the cooling fins in the side regions 296. The remaining cooling fluid travels in the direction of arrow C through the cooling fins of the central region 294. Thus, the cooling fluid is more-evenly distributed in the first transverse direction 252, and cooling effectiveness is more evenly distributed across the entirety of the active regions 210 of the cold plate 200.

Figure 8A:
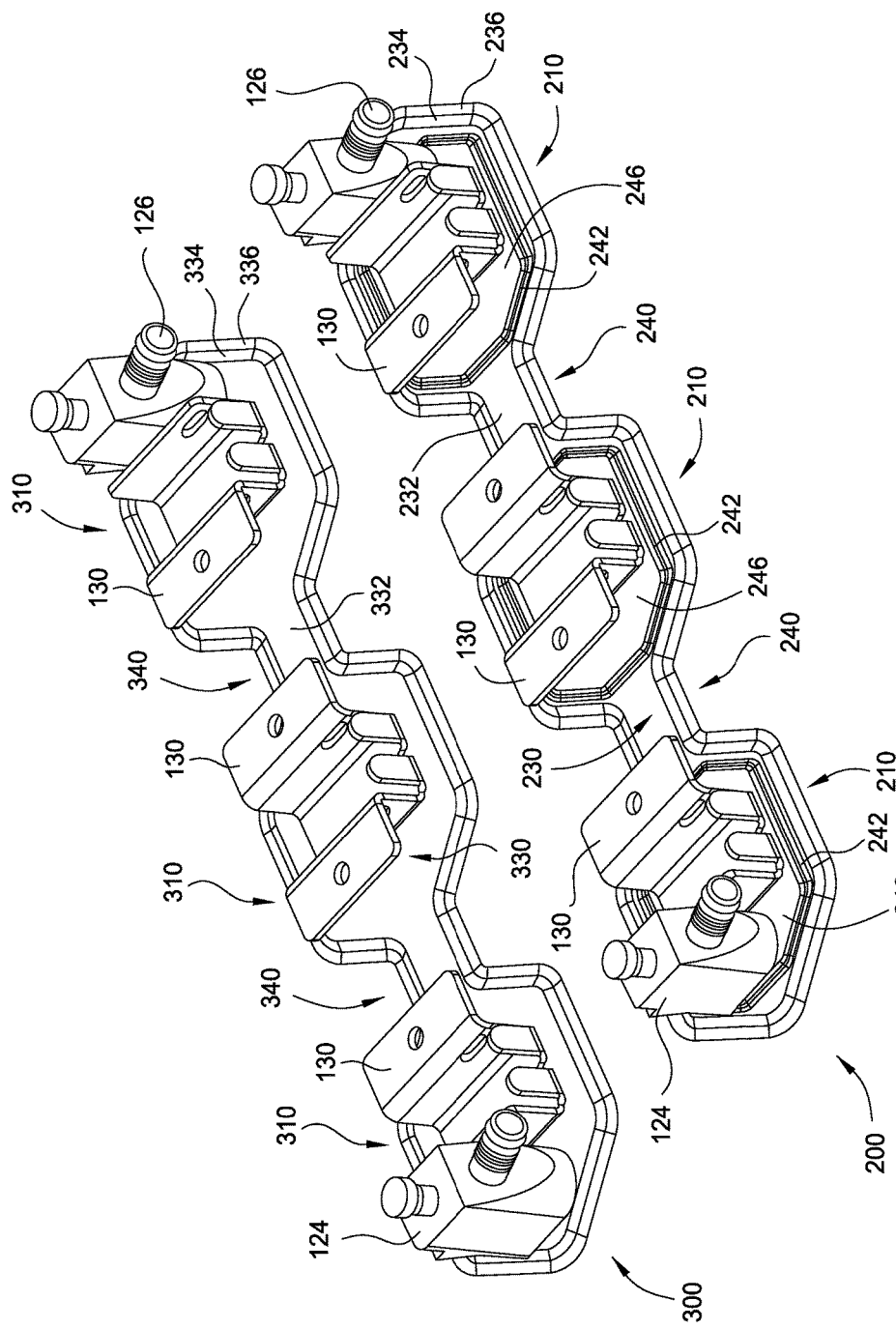
FIG. 8A is a top perspective view of the cold plate of FIG. 1 and a cold plate of another embodiment.
Figure 8B:
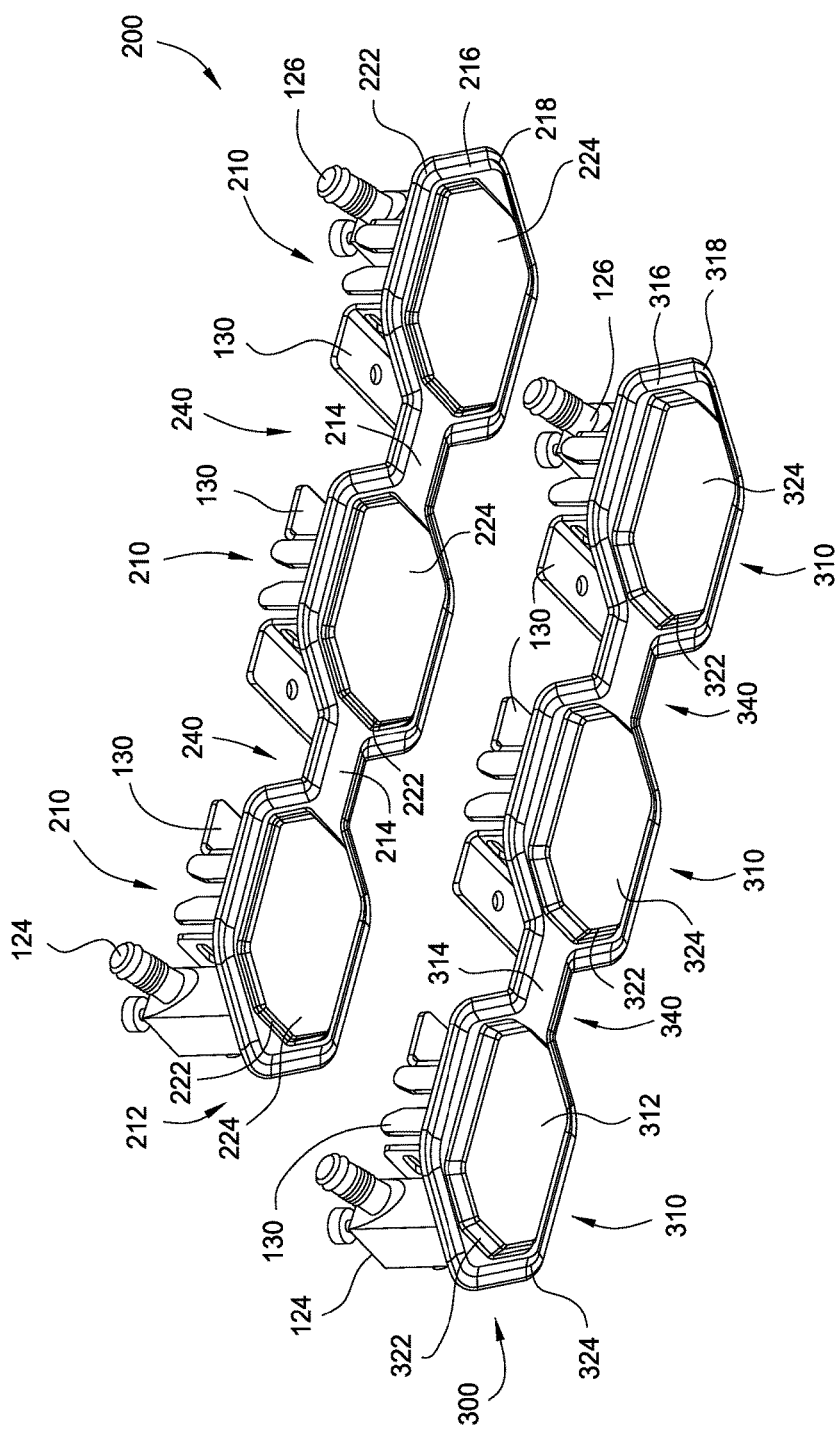
FIG. 8B is a bottom perspective view of the cold plate of FIG. 1 and the cold plate of the other embodiment shown in FIG. 8A.

FIGS. 8A and 8B are top and bottom perspective views of the cold plate 200, discussed above, and another cold plate 300 according to another embodiment. As discussed above with reference to FIG. 4, the plenum 280 in the active areas 210 can be thicker (in the second transverse direction 254) than in the non-active areas 240. The thicker plenum 280 in the active areas 210 of the cold plate 200 is formed by a beveled surface 222 on the interface plate 212 and a beveled surface 242 on the opposing plate 230. The beveled surface 222 on the interface plate 212 forms an interface surface 224, which abuts the electronic components (e.g., the thermal spreaders 104). The beveled surface 242 on the opposing plate 230 forms a clamping surface 246 upon which the respective U channels 130 are mounted. For the alternative cold plate 300, the thicker plenum 280 is formed entirely by a beveled surface 322 on an interface plate 312. The beveled surface 322 forms an interface surface 324, which abuts electronic components. The flat surface 332 of the opposing plate 330 lacks any beveled surfaces that increase the thickness of the plenum 280 at active areas 310 of the cold plate 300.

In instances in which the interface plate 212 and the opposing plate 230 are formed from a sheet metal material, the interface plate 212 and the opposing plate 230 may be formed by stamping. The cold plate 200, in which the increased thickness of the plenum 280 and the active areas 210 is formed by beveled surfaces 242 and 222 on the interface plate 212 and the opposing plate 230, respectively, may be preferable for a stamping process to the cold plate 300. For a given plenum 280 thickness $T_2$ at the active areas, the cold plate 300, and in particular the interface plate 310 of the cold plate 300, requires a deeper stamping draw to form the deeper beveled surface 322 than to form the smaller beveled surface 222 of the cold plate 200. Such a larger draw results in increased residual stresses in the interface plate 312 of the cold plate 300 compared to residual stresses in the interface plate 212 of the cold plate 200. Additionally, the amount of stamping pressure required to form the deeper beveled surface 322 can cause the formation, such as curling of the interface plate 312, that may not occur or that may occur to a lesser degree when forming the shallower beveled surface 222.

In various circumstances, the cold plate 300 with the deeper beveled surface 322 may be preferable to the cold plate 200. For example, the cold plate 300 raises portions of the cold plate 300 away from the interface surface 324 away from the electronics assembly 100, thereby providing additional clearance for physical components of the electronics assembly 100.

In the exemplary embodiments discussed above, the cold plates 200 and 300 have a substantially symmetric profile in the first transverse direction 252. Referring again to FIG. 1, the exemplary illustrated cold plates 200 and 300 are shaped to fit between the spring fasteners 180 on the thermal spreaders 104. In different applications, a cold plate according to embodiments herein could have different profiles, including asymmetric profiles, to fit between other, different features of electrical components.

In embodiments described herein, a cold plate includes active areas configured for arrangement over heat generating electrical components of an electronic assembly and non-active areas configured for arrangement over other portions of the electrical components and that that connect the active areas. The non-active areas have reduced widths and/or thicknesses relative to the active areas (i.e., the non-active areas are necked down relative to the active areas). Such reduced widths and/or thicknesses enable the cold plate to fit between and/or around physical features of the electronic assembly. Such reduced widths and/or thicknesses also enable the non-active areas to bend, twist, flex, or otherwise to form to accommodate any alignment discrepancies between the electrical components of the electronic assembly.

The reduced widths and/or thicknesses of the cold plate in the non-active areas also improve resistance to bursting. In the active areas, the fins, bonded to the flat surfaces of the interface plate and the opposing plate, increase the structural integrity of the active areas, enabling the larger active areas to resist deformation under higher internal pressures. The non-active areas do not include the fins, but the reduced surfaces areas resulting from the reduced widths and/or thicknesses reduces the forces on those surfaces. As a result, the non-active areas are also less susceptible to deformation under higher internal pressures.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing is directed to embodiments of the present disclosure, other and further embodiments of the invention may be devised without departing from the basic scope thereof, and the scope thereof is determined by the claims that follow.

What is claimed is:

1. A method of forming a cold plate, comprising:
   stamping an interface plate from sheet metal, wherein the interface plate is configured for arrangement on an electronics assembly, wherein the interface plate comprises a plurality of active areas arranged for alignment over respective heat-generating portions of the electronics assembly and non-active areas between the active areas;
   affixing a plurality of cooling fins to the interface plate at each of the plurality of active areas, wherein affixing the plurality of cooling fins to the interface plate comprises brazing the plurality of cooling fins to the interface plate;
   stamping an opposing plate from sheet metal;
   joining edges of the interface and opposing plates, wherein edges of the interface plate and the opposing plate form a plenum therebetween, wherein the plenum defines a cooling fluid flow axis from a first end of the plenum to a second end of the plenum, wherein the plenum includes active plenum volumes aligned with the active areas of the interface plate and non-active plenum volumes aligned with the non-active areas of the interface plate, wherein a first width of the active plenum volumes in a first transverse direction to the cooling fluid flow axis is larger than a second width of the non-active plenum volumes in the first transverse direction, and wherein the surfaces of the cooling fins are arranged along the cooling fluid flow axis.

2. The method of claim 1, wherein the interface and opposing plates comprise at least 99.9% pure copper.

3. The method of claim 1, wherein joining the edges of the interface and opposing plates comprises brazing the edges of the interface and opposing plates.

4. The method of claim 1, further comprising brazing the plurality of cooling fins to the opposing plate after joining edges of the interface and opposing plates.

5. The method of claim 1, wherein joining edges of the interface and opposing plates comprises bonding the interface and opposing plates with an epoxy.

6. The method of claim 1, wherein joining edges of the interface and opposing plates comprises welding the interface and opposing plates.

7. The method of claim 1, wherein a first thickness of the active plenum volumes in a second transverse direction to the cooling fluid flow direction and orthogonal to the first transverse direction is larger than a second thickness of the non-active plenum volumes.

8. The method of claim 7, wherein the active plenum volumes are symmetrical in the second transverse direction about a plane bisecting the active plenum, wherein the plane is aligned with the cooling fluid flow direction and the first direction.

9. The method of claim 1, wherein the active plenum volumes include transition regions, wherein widths of the transition regions change from the first width to the second width along the flow axis between the active plenum volumes and adjacent non-active plenum volumes.

10. The method of claim 1, wherein the plurality of cooling fins in each of the active plenum volumes include a central region and side regions arranged on sides of the central direction in the first transverse direction, wherein the surfaces of cooling fins within the central region have a first length along the cooling fluid flow direction, and wherein the surfaces of cooling fins within the side regions have lengths that are shorter than the first length.

11. The method of claim 10, wherein lengths of the surfaces of the cooling fins of the side regions decrease at greater distances from the central region in the first transverse direction.

12. A method of cooling an electronics assembly, comprising:
   positioning an interface plate of a cold plate in thermal contact with the electrical assembly, the interface plate including a plurality of active areas arranged for alignment over respective heat-generating portions of the electronics assembly and non-active areas between the active areas;
   flowing a fluid through a plenum of the cooling plate, the plenum including active plenum volumes aligned with the active areas of the interface plate and non-active plenum volumes aligned with the non-active areas of the interface plate, wherein a first width of the active plenum volumes in a first transverse direction to a fluid flow axis is larger than a second width of the non-active plenum volumes in the first transverse direction, and wherein a first thickness of the active plenum volumes in a second transverse direction to the fluid flow direction and orthogonal to the first transverse direction is larger than a second thickness of the non-active plenum volumes; and
   transferring thermal energy to a plurality of cooling fins arranged in each of the plurality of active plenum volumes, wherein the surfaces of the cooling fins are arranged along a flow axis of the fluid.

13. The method of claim 12, wherein the active plenum volumes are symmetrical in the second transverse direction about a plane bisecting the active plenum, wherein the plane is aligned with the fluid flow direction and the first direction.

14. The method of claim 12, wherein the active plenum volumes include transition regions, wherein widths of the transition regions change from the first width to the second width along the fluid flow axis between the active plenum volumes and adjacent non-active plenum volumes.

15. The method of claim 12, wherein the interface plate comprises copper.

16. The method of claim 12, wherein the interface plate comprises 99.9% copper.

17. A method of cooling an electronics assembly, comprising:
   positioning an interface plate of a cold plate in thermal contact with the electrical assembly, the interface plate including a plurality of active areas arranged for alignment over respective heat-generating portions of the electronics assembly and non-active areas between the active areas;
   flowing a fluid through a plenum of the cooling plate, the plenum including active plenum volumes aligned with the active areas of the interface plate and non-active plenum volumes aligned with the non-active areas of the interface plate, wherein a first width of the active plenum volumes in a first transverse direction to a fluid flow axis is larger than a second width of the non-active plenum volumes in the first transverse direction; and
   transferring thermal energy to a plurality of cooling fins arranged in each of the plurality of active plenum volumes, wherein the surfaces of the plurality of cooling fins are arranged along a flow axis of the fluid, wherein the plurality of cooling fins in each of the active plenum volumes include a central region and side regions arranged on sides of the central direction in the first transverse direction, wherein the surfaces of cooling fins within the central region have a first length along the cooling fluid flow direction, and wherein the surfaces of cooling fins within the side regions have lengths that are shorter than the first length.

18. The method of claim 17, wherein lengths of the surfaces of the cooling fins of the side regions decrease at greater distances from the central region in the first transverse direction.

\* \* \* \* \*